US012791141B2

(12) United States Patent
Wang et al.

(10) Patent No.: US 12,791,141 B2
(45) Date of Patent: Nov. 10, 2026

(54) LATCHING MECHANISM AND DISPLAY DEVICE

(71) Applicant: UNILUMIN GROUP CO., LTD., Shenzhen (CN)

(72) Inventors: Jian Wang, Shenzhen (CN); Xiaosheng Jiang, Shenzhen (CN); Song Lei, Shenzhen (CN)

(73) Assignee: UNILUMIN GROUP CO., LTD., Shenzhen (CN)

( * ) Notice: Subject to any disclaimer, the term of this patent is extended or adjusted under 35 U.S.C. 154(b) by 0 days.

(21) Appl. No.: 19/268,914

(22) Filed: Jul. 14, 2025

(65) Prior Publication Data

US 2026/0185647 A1 Jul. 2, 2026

(30) Foreign Application Priority Data

Dec. 31, 2024 (CN) ......................... 202411997857.5

(51) Int. Cl.

| | |
|---|---|
| ***F16M 11/04*** | (2006.01) |
| ***G09F 9/302*** | (2006.01) |
| ***H05K 5/02*** | (2006.01) |

(52) U.S. Cl.
CPC ........... *F16M 11/04* (2013.01); *G09F 9/3026* (2013.01); *H05K 5/0221* (2013.01); *F16M 2200/028* (2013.01)

(58) Field of Classification Search
CPC .............. F16M 11/04; F16M 2200/028; G09F 9/3026; H05K 5/0221
See application file for complete search history.

(56) References Cited

U.S. PATENT DOCUMENTS

| | | | | |
|---|---|---|---|---|
| 2009/0256047 | A1* | 10/2009 | Zhao | F16M 11/2014 248/161 |
| 2020/0174515 | A1* | 6/2020 | So | F16M 11/08 |
| 2024/0402577 | A1* | 12/2024 | Wu | F16M 11/041 |

* cited by examiner

*Primary Examiner* — Kyu Chae

(74) *Attorney, Agent, or Firm* — PV IP PC; Wei Te Chung

(57) ABSTRACT

The application discloses a latching mechanism and a display device. The latching mechanism includes a fixing assembly and a latching assembly. The fixing assembly includes a fixing seat, a rotating seat and an elastic energy storage member. The rotating seat is rotatably arranged on the fixing seat. The rotating seat is provided with a fixing channel and a plugging interface communicated therewith, the fixing channel is provided with a guiding groove and a locking groove extending circumferentially towards different orientations, and the guiding groove is connected to the locking groove. The latching assembly includes a loathing seat provided with a plugging portion, a latching portion is protruded on a side portion of the plugging portion, the plugging portion is extended into the fixing channel through the plugging interface, and the latching portion is slid into the locking groove along the guiding groove.

20 Claims, 7 Drawing Sheets

LATCHING MECHANISM AND DISPLAY DEVICE

CROSS-REFERENCE APPLICATION

This application claims priority to Chinese Patent Application No. 202411997857.5, filed on Dec. 31, 2024, which is hereby incorporated by reference in its entirety.

TECHNICAL FIELD

The present application relates to a technical field of display devices, and more particularly, to a latching mechanism and a display device.

BACKGROUND

In related arts, a display device includes a case frame and a display unit. The display unit includes a plurality of spliced display modules, each of which is fixed to the case frame by a screw. However, the display module is cumbersome to mount by applying the above-mentioned connection of the display module and the case frame.

SUMMARY

The application aims to solve at least one of the technical problems existing in the related arts. To this end, the present application provides a latching mechanism and a display device, in which a display module can be conveniently assembled on a case rack.

According to a first aspect, an embodiment of the present application provides a latching mechanism including: a fixing assembly, where the fixing assembly includes a fixing seat, a rotating seat, and an elastic energy storage member; the rotating seat is rotatably disposed on the fixing seat; and the elastic energy storage member is connected to the fixing seat and the rotating seat to store a force during a circumferential rotation of the rotating seat; and where the rotating seat is provided with a fixing channel and a plugging interface communicated therewith, an inner peripheral wall of the fixing channel is provided with a guiding groove and a locking groove, the guiding groove and the locking groove extend circumferentially towards different orientations, an end of the guiding groove is communicated with the plugging interface, and another end of the guiding groove is extended away from the plugging interface and is connected with the locking groove; a latching assembly, where the latching assembly includes a latching seat provided with a plugging portion, a latching portion is protruded on a side portion of the plugging portion, the plugging portion is extended into the fixing channel through the plugging interface, and the latching portion is slid into the locking groove along the guiding groove; and where in a case that the latching portion is slid along the guiding groove, the rotating seat is adapted with a movement of the latching portion to rotate in a circumferential direction for the elastic energy storage member to store energy; and in a case that the latching portion moves to the locking groove, the elastic energy storage member drives the rotating seat to rotate in another circumferential direction to slide the latching portion into the locking groove.

According to a second aspect, an embodiment of the present application provides a display device including:

a rack, a display module, and the above-mentioned latching mechanism, where the fixing seat is integrated or connected to the rack, and the locking seat is integrated or connected to a bottom shell of the display module.

REFERENCE NUMERALS

Figure 1:
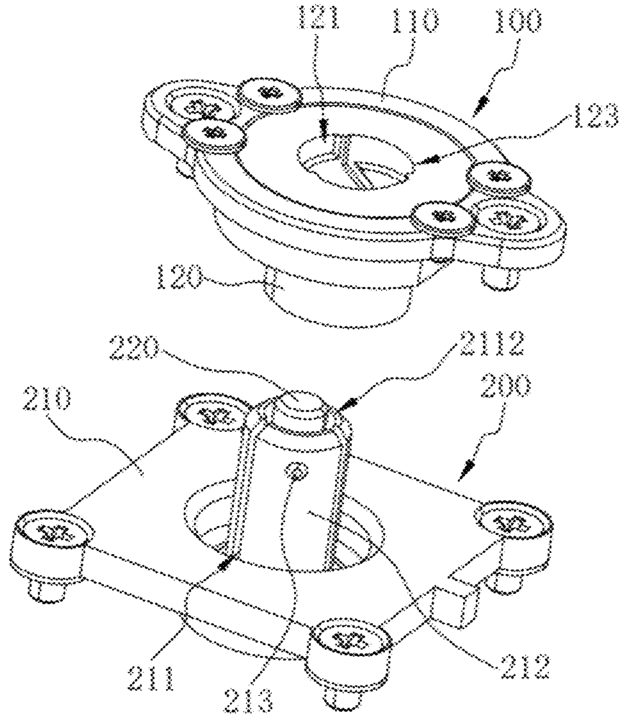
FIG. 1 is a schematic structural diagram of a latching mechanism according to an embodiment of the present application.

100. fixing assembly; 110. fixing seat; 111. peripheral plate; 112. end cap; 113. enclosed space; 114. first latch; 120. rotating seat; 121. fixing channel; 122. plugging interface; 123. second extension outlet; 124. guiding groove; 125. locking groove; 126. flip portion; 127. second latch; 130. elastic energy storage member; 200. latching assembly; 210. latching seat; 211. plugging portion; 2111. movable channel; 2112. first extension outlet; 2113. relief opening; 212. elastic arm; 2121. first extension; 2122. second extension; 213. latching portion; 220. locking rod; 221. protruding portion; 222. pressing portion; 230. elastic member; 300. display module; 310. bottom shell; 320. suction hole; and 400. rack.

DETAILED DESCRIPTION OF THE EMBODIMENTS

Embodiments of the present application are described in detail below, examples of which are illustrated in the accompanying drawings, in which identical or similar reference numerals refer to identical or similar elements or elements having identical or similar functions throughout. The embodiments described below by reference to the accompanying drawings are exemplary and are merely illustrative of the application and are not to be construed as limiting the application.

In the description of the present application, it should be understood that the orientation or positional relationship referred to in the description of the orientation, e.g., up, down, front, back, up, down, etc., is based on the orientation or positional relationship shown in the drawings, merely for ease of description and simplification of the description of the present application, and not to indicate or imply that the devices or elements referred to must have a particular orientation, be constructed and operated in a particular orientation, and therefore should not be construed as limiting the present application.

In the description of the present application, the term "several" means more than one; the term "a plurality of" means more than two; the term "greater than, less than, more than, etc." is to be understood as not including the present number; and the term "above, below, within, etc." is to be understood as including the present number. The terms "first" and "second" are described for the purpose of distinguishing technical features only, it is not to be construed as indicating or implying relative importance or implicitly indicating the number of indicated technical features or implicitly indicating the order of the indicated technical features.

In the description of the present application, unless expressly defined otherwise, words such as arrangement, installation, connection, and the like are to be understood in a broad sense, and those skilled in the art may reasonably determine the specific meaning of the above words in the present application in connection with the specific contents of the technical solution.

In the description of the present application, reference to the term "one embodiment", "some embodiments", "illustrative embodiments", "examples", "specific examples", or "some examples", etc. means that a particular feature, structure, material, or characteristic described in connection with the embodiment or example is included in at least one embodiment or example of the present application. In the present specification, the schematic representation of the above terms does not necessarily refer to the same embodiments or examples. Moreover, the specific features, structures, materials, or features described may be combined in any one or more embodiments or examples in a suitable manner.

The present application will now be described in further detail with reference to the accompanying drawings.

Figure 2:
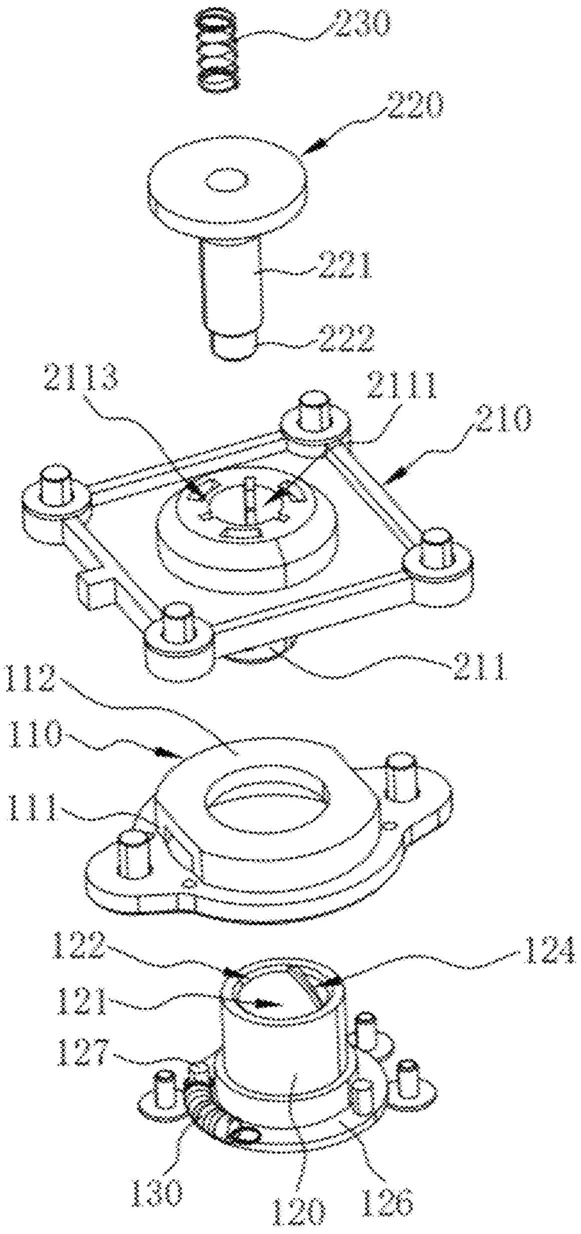
FIG. 2 is a schematic explosive diagram of a latching mechanism according to an embodiment of the present application.
Figure 3:
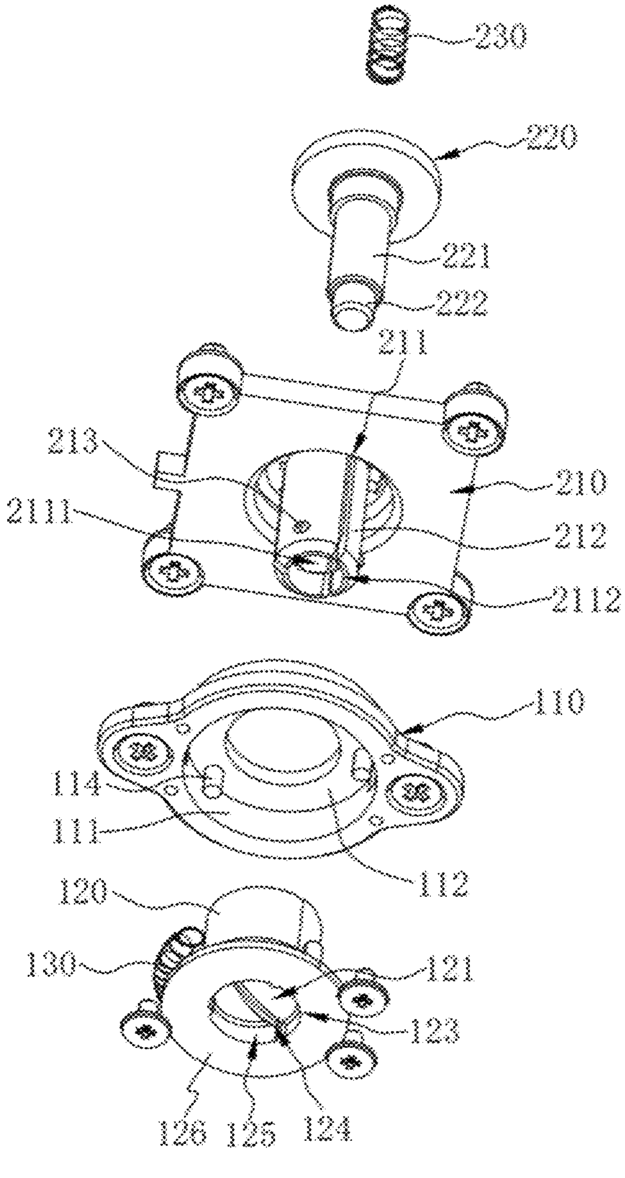
FIG. 3 is another schematic structural diagram of a latching mechanism according to an embodiment of the present application.

Referring to FIG. 1 to FIG. 3, a latching mechanism according to an embodiment of the present application is provided. The latching mechanism is applied to a display device, and is described with reference to the application to the display device, but is not limited to only the display device. The latching mechanism includes a fixing assembly 100 and a latching assembly 200. The fixing assembly 100 is fixed to a rack 400 of the display device, and the latching assembly 200 is connected to a bottom shell 310 of a display module 300 of the display device. The latching assembly 200 is connected to the fixing assembly 100, to assemble the display module 300 to the rack 400 (see FIG. 6 and FIG. 7).

Figure 5:
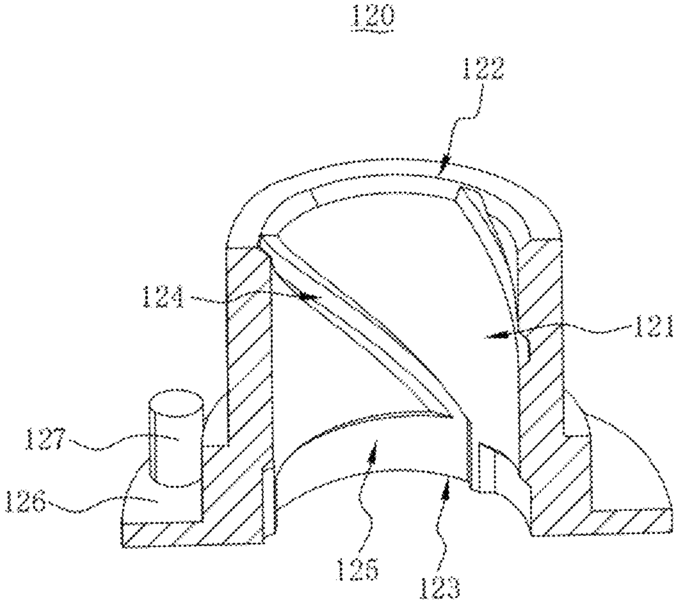
FIG. 5 is a schematic structural diagram of a rotating seat according to an embodiment of the present application.

The fixing assembly 100 includes a fixing seat 110, a rotating seat 120, and an elastic energy storage member 130. The fixing seat 110 is integrated or assembled to the rack 400, the rotating seat 120 is rotatably provided on the fixing seat 110, and the elastic energy storage member 130 is connected to the fixing seat 110 and the rotating seat 120. The elastic energy storage member 130 is configured to accumulate force when the rotating seat 120 rotates circumferentially. The rotating seat 120 is provided with a fixing channel 121 and a plugging interface 122, and the fixing channel 121 and the plugging interface 122 are communicated. An inner peripheral wall of the fixing channel 121 is provided with a guiding groove 124 and a locking groove 125 (see FIG. 5), the guiding groove 124 and the locking groove 125 extend circumferentially towards different orientations. An end of the guiding groove 124 communicates with the plugging interface 122, and another end of the guiding groove 124 extends away from the plugging interface 122 and is connected to the locking groove 125.

The latching assembly 200 includes a latching seat 210 which is integrated or connected to a bottom shell 310 of the display module 300, and a side portion of the plugging portion 211 is provided with a protruded latching portion 213. The plugging portion 211 is extended into the fixing channel 121 through the plugging interface 122, and the latching portion 213 is slid into the locking groove 125 along the guiding groove 124. When the latching portion 213 slides along the guiding groove 124, the rotating seat 120 is adapted with a movement of the latching portion 213 to rotate along a circumferential direction for the elastic energy storage member 130 to store energy. When the latching portion 213 moves to the locking groove 125, the elastic energy storage member 130 drives the rotating seat 120 to rotate in another circumferential direction to slide the latching portion 213 into the locking groove 125.

Specifically, during assembly of the display module 300 and the rack 400, the latching portion 213 is aligned with the end of the guiding groove 124 at the plugging interface 122, the plugging portion 211 is extended into the fixing channel 121 from the plugging interface 122, and the latching portion 213 is slid along the guiding groove 124 into the locking groove 125 and is held in the locking groove 125, thereby assembling the latching seat 210 to the fixing assembly 100, and conveniently assembling the display module 300 to the rack 400. The guiding groove 124 extends circumferentially from the plugging interface 122 toward another end of the fixing channel 121, as such, when the plugging portion 211 is inserted into the fixing channel 121, the latching portion 213 drives the rotating seat 120 to rotate in a forward direction during sliding along the guiding groove 124, and the rotating seat 120 pulls the elastic energy storage member 130 to be extended in the forward direction to effectively obtain a stored force. When the latching portion 213 is moved to the locking groove 125, the elastic energy storage member 130 starts to release and to supply a circumferential force in a reverse direction to the rotating seat 120, whereby the rotating seat 120 rotates in the reverse direction under a driving of the elastic energy storage member 130. As such, the latching portion 213 slides into the locking groove 125, thereby fixedly connecting the latching seat 210 to the fixing seat 110, and accordingly, assembling the display module 300 to the rack 400.

It should be emphasized that the locking groove 125 needs to lock the latching portion 213. The locking groove 125 extends circumferentially, but extends axially less or not, thus, the locking groove 125 can lock the latching portion 213. According to the present application, by the arrangement of the elastic energy storage member 130, the latching portion 213 can be effectively slid into the locking groove 125. The elastic energy storage member 130 holds the position of the rotating seat 120 to limit the rotation of the rotating seat 120 after release of the force, so that the latching portion 213 is held in the locking groove 125, and the latching seat 210 is stably fitted to the fixing member 100.

In some embodiments, referring to FIG. 2 and FIG. 3, the guiding groove 124 is arranged as a helix shape on an inner peripheral wall of the fixing channel 121 (specifically, reference may be made to FIG. 5), and a helix angle of the guiding groove 124 is less than or equal to 15 degrees, so that the helix angle of the guiding groove 124 is less than a self-locking angle of the guiding groove 124. That is, the guiding groove 124 extends a large length along a axial direction of the fixing channel 121 during the circumferential extension. As such, the latching portion 213 can drive the rotating seat 120 to rotate during the sliding of the latching portion 213 along the guiding groove 124, thereby the elastic energy storage member 130 effectively obtaining a stored force for subsequently driving the rotating seat 120 to rotate.

In other possible embodiments, the guiding groove 124 is inclined circumferentially along the inner peripheral wall of the fixing channel 121, and the guiding groove 124 has an inclined angle less than 50 degrees with respect to a length direction of the fixing channel 121. That is, the guiding groove 124 extends along the length direction of the fixing channel 121 by a large length during circumferential extension of the guiding groove 124. With this arrangement, the latching portion 213 can drive the rotating seat 120 to rotate during the sliding of the latching portion 213 along the guiding groove 124, thereby the elastic energy storage member 130 effectively obtaining a stored force for subsequently driving the rotating seat 120 to rotate.

In some embodiments, referring to FIG. 2 and FIG. 3, the locking groove 125 is arranged as a helix shape on the inner peripheral wall of the fixing channel 121 (specifically, reference may be made to FIG. 5), and a helix angle of the locking groove 125 is greater than or equal to 20 degrees, so that the helix angle of the locking groove 125 is less than or equal to the self-locking angle of the locking groove 125. That is, the locking groove 125 extends a small length along the length direction of the fixing channel 121 during the circumferential extension, and the latching portion 213 can be held in the locking groove 125 and cannot be slid back into the guiding groove 124 after the latching portion 213 is slid into the locking groove 125. As such, the latching seat 210 can be securely assembled to the fixing assembly 100, thereby ensuring that the display module 300 is securely assembled to the rack 400.

It should be noted that the locking groove 125 is provided in the helix shape, and the rotating seat 120 pulls the latching seat 210 toward the fixing member 100 through the latching portion 213 during the driving rotating seat 120 being rotated by the elastic energy storage member 130, thereby reducing a gap between the display module 300 and the rack 400, and thereby ensuring the flatness of mounting the display module 300.

In other possible embodiments, the locking groove 125 is provided only circumferentially extending but not axially extending, and the locking groove 125 may likewise lock the latching portion 213 to prevent the latching portion 213 from disengaging from the locking groove 125 and sliding back into the guiding groove 124, thereby ensuring that the display module 300 is securely fitted to the rack 400.

In order to facilitate the installation of the elastic energy storage member 130, in some embodiments, referring to FIG. 2 and FIG. 3, the fixing seat 110 is provided with a peripheral plate 111 and an end cap 112, and the peripheral plate 111 is connected to a periphery of the end cap 112. The rotating seat 120 is rotatably passed through a central position of the end cap 112, and an annular enclosed space 113 is formed between an outer peripheral surface of the rotating seat 120 and an inner peripheral surface of the peripheral plate 111 (see FIG. 4). At the same time, a bottom of the rotating seat 120 is enlarged to a periphery thereof to provide a flip portion 126, and the flip portion 126 is provided corresponding to the end cap 112. The end cap 112 is provided with a first latch 114 extending toward the flip portion 126, and the flip portion 126 is provided with a second latch 127 extending toward the end cap 112. The first latch 114 and the second latch 127 are spaced apart in the circumferential direction of the enclosed space 113. The elastic energy storage member 130 may be a tension spring, and the tension spring is in an arc shape and provided in the enclosed space 113. An end of the tension spring is hooked on the first latch 114 and the other end thereof is hooked on the second latch 127. Thus, the elastic energy storage member 130 is conveniently connected to the peripheral side of the fixing seat 110 and the rotating seat 120, and the force can be effectively stored during the rotation of the rotating seat 120.

Figure 4:
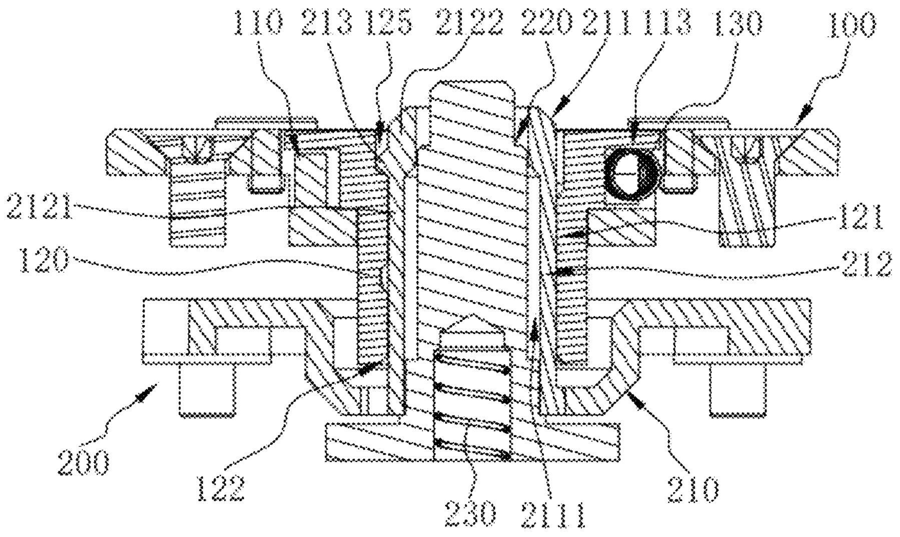
FIG. 4 is a schematic axial sectional diagram of a latching mechanism according to an embodiment of the present application.

In some embodiments, referring to FIG. 2 to FIG. 4, the latching assembly 200 further includes a locking rod 220, and the plugging portion 211 is provided with a movable channel 2111 in the axial direction thereof. The locking rod 220 is slidably provided in the movable channel 2111 in the axial direction of the plugging portion 211 to control the fit of the latching portion 213 in the locking groove 125 and the separation of the latching portion 213 from the locking groove 125, or the locking rod 220 is circumferentially rotatably provided in the movable channel 2111 to control the fit of the latching portion 213 in the locking groove 125 and the separation of the latching portion 213 from the locking groove 125.

In a specific application, when it is necessary to assemble the display module 300, the operator controls the locking rod 220 to slide axially or rotate circumferentially, thereby controlling the latching portion 213 to expand in the radial direction, and the latching portion 213 is radially fitted into the locking groove 125, and thereby achieving the axial limitation between the plugging portion 211 and the rotating seat 120. Thus, the plugging portion 211 can be conveniently connected to the fixing channel 121, and the display module 300 can be conveniently assembled to the rack 400. When it is necessary to disassemble the display module 300, the operator controls the locking rod 220 to slide axially or rotate circumferentially in a reverse direction, thereby controlling the latching portion 213 to return back in the radial direction, and the latching portion 213 is radially separated from the locking groove 125, and thereby releasing the axial limitation between the plugging portion 211 and the rotating seat 120. Thus, the plugging portion 211 can be conveniently withdrawn from the fixing channel 121, and the display module 300 can be conveniently disassembled from the rack 400.

In other possible embodiments, the latching portion 213 is an elastically retractable locking member (not shown) disposed to a side portion of the plugging portion 211, and an end portion of the locking member is provided with a rounded corner. When the operator acts on the display module 300 in a direction away from the rack 400 to disassemble the display module 300, the locking member is retracted toward the inner side of the plugging portion 211, so that the axial limitation between the plugging portion 211 and the rotating seat 120 is released, and the display module 300 can be easily disassembled from the rack 400.

In order to enable the locking rod 220 to control the return of the latching portion 213, in a possible embodiment, referring to FIG. 2 to FIG. 4, the plugging portion 211 is provided with one or more elastic arms 212 in the circumferential direction of the movable channel 2111, each of the elastic arms 212 is elastically deformable outwardly or inwardly, and the latching portion 213 is a protruded portion provided on an outer side of the elastic arm 212. The locking rod 220 is movably provided among the elastic arms 212, and the locking rod 220 controls the elastic arms 212 to expand or retract during the axial sliding of the locking rod 220 in the movable channel 2111 or during the circumferential rotation of the locking rod 220 in the movable channel 2111, thereby controlling the latching portion 213 to move outwardly or return inwardly.

In a specific application, when the display module 300 is assembled to the rack 400, the operator can conveniently control each of the elastic arms 212 in an expand state through the locking rod 220 and control the latching portion 213 in an outwardly protruded state, and the latching portion 213 can be slid into the locking groove 125 along the guiding groove 124. As such, the latching seat 210 is connected to the fixing assembly 100, and the display module 300 is securely assembled to the rack 400. When it is necessary to disassemble the display module 300 from the rack 400, the operator can conveniently release the limitation of the elastic arms 212 through the locking rod 220, and the elastic arms 212 can be elastically deformed inwardly. As such, the latching portion 213 can be brought into an inwardly returned state, and the latching portion 213 is radially disengaged from the locking groove 125, thereby releasing the axial limitation between the plugging portion 211 and the rotating seat 120. Thus, the plugging portion 211 can be conveniently withdrawn from the fixing channel 121, and the display module 300 can be conveniently disassembled from the rack 400.

In order to enable the locking rod 220 to control the elastic arms 212 to be elastically expand and retract, in an embodiment, a first extension 2121 and a second extension 2122 (see FIG. 4) is provided along the length of the elastic arms 212. The first extension 2121 and the second extension 2122 are connected, the first extension 2121 is connected to the bottom of the latching seat 210, the second extension 2122 is closer to the fixing seat 110 than the first extension 2121, and the latching portion 213 is provided on an outer side of the second extension 2122. The second extension 2122 has a thicker inner diameter than the first extension 2121, or the inner side of the second extension 2122 is protruded inwardly with respect to the inner side of the first extension 2121.

The locking rod 220 is provided with a protruding portion 221. When a side wall of the protruding portion 221 abuts against an inner side of the second extension 2122, the elastic arms 212 are in an outwardly expanded state, and the latching portion 213 is in an outwardly protruded state. As such, the latching portion 213 is fitted into the locking groove 125 to axially restrict the plugging portion 211 and the rotating seat 120, thereby ensuring that the display module 300 is securely assembled to the rack 400. When the side wall of the protruding portion 221 is located inside the first extension 2121, the elastic arms 212 are elastically deformable inwardly. As such, the latching portion 213 can be in an inwardly returned state. Therefore, the latching portion 213 can be radially disengaged from the locking groove 125, thereby releasing the axial limitation between the plugging portion 211 and the rotating seat 120. The plugging portion 211 can be conveniently withdrawn from the fixing channel 121, and the display module 300 can be conveniently detached from the rack 400.

In other possible embodiments, a projection is provided on the peripheral side of the locking rod 220. During the circumferential rotation of the locking rod 220, the locking rod 220 pushes the elastic arms 212 outwardly by the projection, and the elastic arms 212 are changed from the retracted state to the expanded state, so that the latching portion 213 can be inserted into the locking groove 125. When the projection on the peripheral side of the elastic arm 212 does not jack the elastic arms 212, the elastic arms 212 are in the retracted state, and the latching portion 213 is separated from the locking groove 125.

In place of the above-described arrangement of the latching portion 213, in other possible embodiments, a side portion of the plugging portion 211 is provided with a guiding hole communicating with the movable channel 2111 in the radial direction thereof, and the latching portion 213 is a ball movably provided in the guiding hole, and an inner portion of the ball can be abutted with the locking rod 220. Specifically, during axial sliding or circumferential rotation of the locking rod 220 in the movable channel 2111, the side wall of the locking rod 220 acts on the ball, so that the ball is protruded outwardly to be held in the locking groove 125. When the side wall of the locking rod 220 releases the force on the ball, the ball can be retracted toward the inside of the movable channel 2111, thereby releasing the axial limitation between the plugging portion 211 and the rotating seat 120, and thereby easily disassembling the display module 300 from the rack 400.

In some embodiments, referring to FIG. 2 to FIG. 4, if the locking rod 220 is axially slidably disposed in the movable channel 2111, the latching assembly 200 further includes an elastic member 230 disposed in the locking rod 220, and the elastic member 230 is configured to provide a spring force toward the rotating seat 120 to the locking rod 220 to reset the locking rod 220 to a locked position. When the locking rod 220 is displaced to the locking position, the locking rod 220 keeps the latching portion 213 embedded in the locking groove 125.

Specifically, a relief opening 2113 is provided on the bottom of the latching seat 210 away from the rotating seat 120, and the relief opening 2113 communicates with the movable channel 2111. The latching seat 210 is connected to the bottom shell 310 of the display module 300 (see FIG. 7), and the elastic member 230 may be a spring provided inside the locking rod 220. An end of the elastic member 230 abuts against the bottom shell 310 of the display module 300, and another end of the elastic member 230 abuts against an end of the locking rod 220 close to the relief opening 2113, whereby the elastic member 230 provides an elastic force toward the fixing seat 110 to the locking rod 220. When the locking rod 220 is not subjected to an external force, the locking rod 220 is slidably moved toward the rotating seat 120 to the locking position by the elastic member 230. At this time, the locking rod 220 restricts the return of the latching portion 213, so that the latching portion 213 is held in the locking groove 125, and the display module 300 is securely assembled to the rack 400.

In a specific application, when the operator urges the locking rod 220 in the direction toward the bottom shell 310 of the display module 300, the protruding portion 221 of the locking rod 220 slides to the inner side of the first extension 2121, thereby releasing the limitation on the elastic arms 212. As a result, each of the elastic arms 212 can be elastically deformed inwardly, and the latching portion 213 can be returned inwardly, so that the latching portion 213 can be disengaged from the locking groove 125, and the axial limitation between the latching seat 210 and the rotating seat 120 can be removed, thereby facilitating the disassembly of the display module 300. When the operator stops the force on the locking rod 220, the elastic member 230 pushes the locking rod 220 to move toward the rotating seat 120, and the locking rod 220 is reset to the locking position under the action of the elastic member 230. At this time, the protruding portion 221 of the locking rod 220 moves to the inside of the second extension 2122. As a result, each of the elastic arms 212 cannot be elastically deformed inwardly under the limitation of the locking rod 220, and the latching portion 213 on the elastic arm 212 is held in an outwardly protruded state, so that the latching portion 213 can be slid into the locking groove 125 along the guiding groove 124, thereby fixedly assembling the display module 300 to the rack 400.

In some embodiments, referring to FIG. 1 and FIG. 3, a plugging end of the plugging portion 211 is provided with a first extension outlet 2112, and an end of the rotating seat 120 away from the plugging interface 122 is provided with a second extension outlet 123 communicating with the fixing channel 121. When the plugging portion 211 is inserted into the fixing channel 121, the plugging end of the plugging portion 211 is located at or near the second extension outlet 123. The locking rod 220 is provided with a pressing portion 222 connected to the protruding portion 221, and the pressing portion 222 extends through the first extending outlet 2112 and the second extending outlet 123 outside the bottom of the fixing seat 110.

In a specific application, if it is necessary to disassemble the display module 300, the operator pushes the pressing portion 222 from the back side of the rack 400 toward the display module 300, and the locking rod 220 moves toward the display module 300 against the elastic force of the elastic member 230, and the protruding portion 221 of the locking rod 220 slides to the inner side of the first extension 2121, thereby relieving the limitation on the elastic arms 212. As a result, each of the elastic arms 212 can be elastically deformed inwardly, and the latching portion 213 is elastically returned inwardly, so that the latching portion 213 can be disengaged from the locking groove 125, and the axial limitation between the latching seat 210 and the rotating seat 120 can be removed, thereby facilitating the disassembly of the display module 300. If it is necessary to re-assemble the locking seat 210 to the rotating seat 120, the operator stops acting on the pressing portion 222. As such, the locking rod 220 returns to the locking position under the action of the elastic member 230, the protruding portion 221 moves to the inner side of the second extension 2122, and the lock portion 213 is held in the outwardly protruded state, so that the latching portion 213 can be slid into the locking groove 125 along the guiding groove 124 to assemble the display module 300 to the rack 400.

Figure 6:
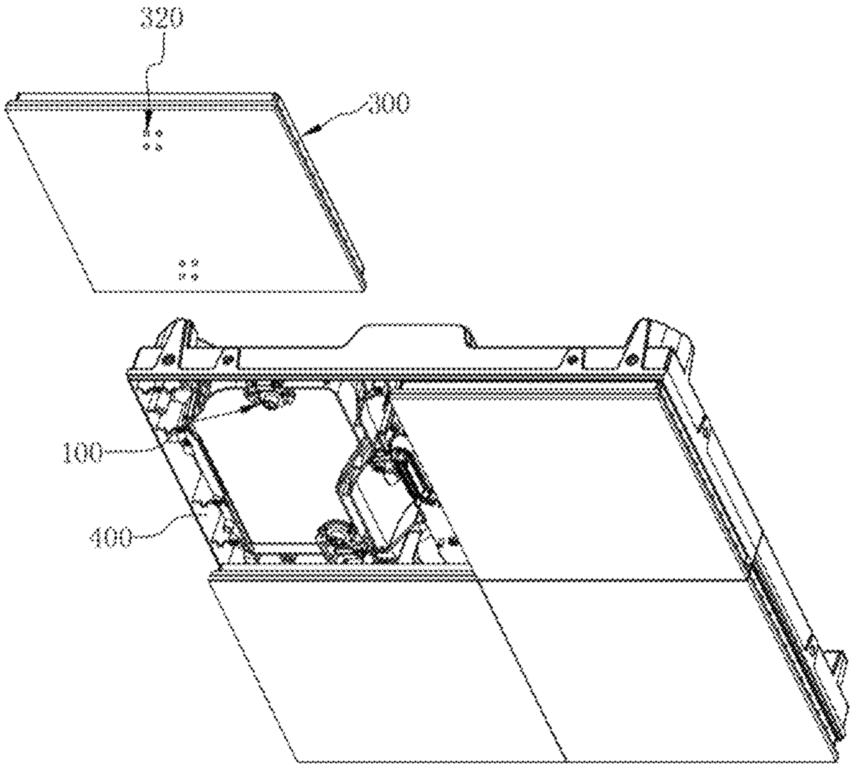
FIG. 6 is a schematic structural diagram of a display device according to an embodiment of the present application.
Figure 7:
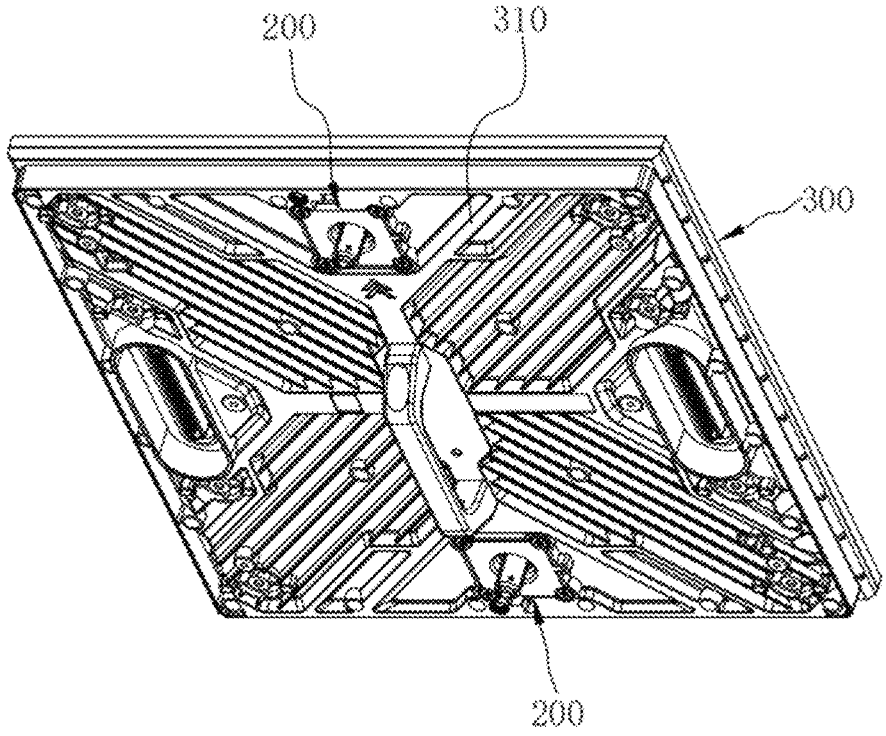
FIG. 7 is a schematic structural diagram of a display module according to an embodiment of the present application.

In some embodiments, referring to FIG. 1, FIG. 6, and FIG. 7, the locking rod 220 is made of a magnetic material, for example a metallic material, such as iron, stainless steel, and the like, and can be moved toward the relief opening 2113 by a magnetic force from the relief opening 2113. Specifically, the relief opening 2113 is provided to face the display module 300, and an external magnetic member is placed on a front surface of the display module 300 at a position corresponding to the relief opening 2113. Then, the magnetic member generates a magnetic force toward the display module 300 to the locking rod 220 through the relief opening 2113, the locking rod 220 moves toward the display module 300 against the elastic force of the elastic member 230, and the protruding portion 221 of the locking rod 220 slides to the inner side of the first extension 2121, thereby relieving the limitation on the elastic arms 212. As a result, each of the elastic arms 212 can be elastically deformed inwardly, and the latching portion 213 is returned inwardly to be disengaged from the locking groove 125, and the axial limitation between the latching seat 210 and the rotating seat 120 can be removed, thereby facilitating the disassembly of the display module 300. If the magnetic member stops attracting the locking rod 220, the locking rod 220 returns to the locking position under the action of the elastic member 230, the protruding portion 221 moves to the inner side of the second extension 2122, and the latching portion 213 is held in the outwardly protruded state. As such, the latching portion 213 can slide into the locking groove 125 along the guiding groove 124, thereby securely assembling the display module 300 to the rack 400.

In some embodiments, referring to FIG. 1 and FIG. 3, the locking rod 220 can be moved toward the relief opening 2113 by a negative pressure from the relief opening 2113. Specifically, the relief opening 2113 is provided to face the display module 300, and a suction cup of an external negative pressure source is disposed on a front surface of the display module 300 and is located at a position corresponding to the relief opening 2113. Meanwhile, the display module 300 is further provided with a suction hole 320 located between the suction cup of the negative pressure source and the relief opening 2113. Then, the negative pressure source sucks the air in the mounting cavity through the suction hole 320. At this time, the locking rod 220 moves in the direction of the display module 300 against the force of the elastic member 230 under the action of the atmospheric pressure, and the protruding portion 221 of the locking rod 220 slides to the inner side of the first extension 2121, thereby releasing the limitation on the elastic arms 212. As a result, each of the elastic arms 212 can be elastically deformed inwardly, and the latching portion 213 is returned inwardly, so that the latching portion 213 can be disengaged from the locking groove 125, and the axial limitation between the latching seat 210 and the rotating seat 120 can be removed, thereby facilitating the disassembly of the display module 300. When the negative pressure source stops operation, the locking rod 220 returns to the locking position under the action of the elastic member 230, the protruding portion 221 moves to the inner side of the second extension 2122, and the latching portion 213 is held in the protruded state. As such, the latching portion 213 can slide into the locking groove 125 along the guiding groove 124, thereby securely assembling the display module 300 to the rack 400.

Referring to FIG. 1, FIG. 6, and FIG. 7, a display device includes a rack 400, a display module 300, and a latching mechanism as described above, where a fixing seat 110 is integrated or connected to the rack 400, and a latching seat 210 is integrated or connected to a bottom shell 310 of the display module 300.

Specifically, during assembly of the display module 300 and the rack 400, the latching portion 213 is aligned with the end of the guiding groove 124 at the plugging interface 122, the plugging portion 211 extends from the plugging interface 122 into the fixing channel 121, and the latching portion 213 slides along the guiding groove 124 into the locking groove 125 and is held in the locking groove 125, thereby assembling the latching seat 210 to the fixing assembly 100, and conveniently assembling the display module 300 to the rack 400. The guiding groove 124 extends circumferentially from the plugging interface 122 toward another end of the fixing channel 121, as such, when the plugging portion 211 is inserted into the fixing channel 121, the latching portion 213 drives the rotating seat 120 to rotate in a forward direction during sliding along the guiding groove 124, and the rotating seat 120 pulls the elastic energy storage member 130 to be extended in the forward direction to effectively obtain a stored force. When the latching portion 213 is moved to the locking groove 125, the elastic energy storage member 130 starts to release and supply a circumferential force in a reverse direction to the rotating seat 120, whereby the rotating seat 120 rotates in the reverse direction under a driving of the elastic energy storage member 130. As such, the latching portion 213 slides into the locking groove 125, thereby fixedly connecting the latching seat 210 to the fixing seat 110, and accordingly, assembling the display module 300 to the rack 400.

The technical means disclosed in the solution of the present application is not limited to the technical means disclosed in the above-described embodiment, but includes a technical solution composed of any combination of the above technical features. It should be noted that several modifications and embellishments may be made by those skilled in the art without departing from the principles of the application, which are also considered to be within the scope of the application.

The invention claimed is:

1. A latching mechanism, comprising:

a fixing assembly, wherein the fixing assembly includes a fixing seat, a rotating seat, and an elastic energy storage member; the rotating seat is rotatably disposed on the fixing seat; and the elastic energy storage member is connected to the fixing seat and the rotating seat to store a force during a circumferential rotation of the rotating seat; and wherein the rotating seat is provided with a fixing channel and a plugging interface communicated therewith, an inner peripheral wall of the fixing channel is provided with a guiding groove and a locking groove, the guiding groove and the locking groove extend circumferentially towards different orientations, an end of the guiding groove is communicated with the plugging interface, and another end of the guiding groove is extended away from the plugging interface and is connected with the locking groove;

a latching assembly, wherein the latching assembly includes a latching seat provided with a plugging portion, a latching portion is protruded on a side portion of the plugging portion, the plugging portion is extended into the fixing channel through the plugging interface, and the latching portion is slid into the locking groove along the guiding groove; and wherein in a case that the latching portion is slid along the guiding groove, the rotating seat is adapted with a movement of the latching portion to rotate in a circumferential direction for the elastic energy storage member to store energy; and in a case that the latching portion moves to the locking groove, the elastic energy storage member drives the rotating seat to rotate in another circumferential direction to slide the latching portion into the locking groove.

2. The latching mechanism according to claim 1, wherein the guiding groove is arranged as a helix shape on an inner peripheral wall of the fixing channel, and a helix angle of the guiding groove is less than or equal to 15 degrees.

3. The latching mechanism according to claim 1, wherein the guiding groove is inclined circumferentially along the inner peripheral wall of the fixing channel.

4. The latching mechanism according to claim 1, wherein the locking groove is arranged as a helix shape on the inner peripheral wall of the fixing channel, and a helix angle of the locking groove is greater than or equal to 20 degrees.

5. The latching mechanism according to claim 1, wherein the plugging portion comprises with a movable channel in an axial direction thereof, and the latching assembly further comprises a locking rod slidably provided in the movable channel or circumferentially rotatably provided in the movable channel to control a fit of the latching portion in the locking groove and a separation of the latching portion from the locking groove.

6. The latching mechanism according to claim 5, wherein the latching portion is a ball radially movable on the side portion of the plugging portion, to protrude from the side portion of the plugging portion and retract in the side portion of the plugging portion.

7. The latching mechanism according to claim 6, wherein the ball is contactable with the locking rod; during axial sliding or circumferential rotation of the locking rod in the movable channel, the ball is contacted with the locking rod to protrude or the ball is separated from the locking rod to retract.

8. The latching mechanism according to claim 5, wherein the plugging portion is provided with one or more elastic arms in a circumferential direction of the movable channel, the latching portion is protruded on an outer side of the elastic arm, and the locking rod is movable to control expansion or retraction of the elastic arms during the locking rod being rotated or slid.

9. The latching mechanism according to claim 8, wherein the elastic arm is provided with a first extension and a second extension connected therewith, an inner side of the second extension is protruded inwardly with respect to an inner side of the first extension, and the locking rod is provided with a protruding portion; in a case that the protruding portion is slid to the inner side of the second extension section, the latching portion is held in the locking groove; in a case that the protruding portion is slid to the inner side of the first extension, the latching portion is separated from the locking groove.

10. The latching mechanism according to claim 9, wherein the latching assembly further includes an elastic member disposed in the locking rod, and the elastic member is configured to provide a spring force toward the rotating seat to the locking rod to reset the locking rod to a locked position; and wherein, in a case that the locking rod is displaced to the locking position, the locking rod keeps the latching portion embedded in the locking groove.

11. The latching mechanism according to claim 10, wherein the elastic member is a spring provided inside the locking rod, an end of the elastic member abuts against a bottom shell of the display module, and another end of the elastic member abuts against the locking rod.

12. The latching mechanism according to claim 10, wherein a plugging end of the plugging portion is provided with a first extension outlet, and an end of the rotating seat away from the plugging interface is provided with a second extension outlet, and the locking rod is passed through the first extension outlet and the second extension outlet and is extendable outside a bottom of the fixing seat.

13. The latching mechanism according to claim 12, wherein the locking rod is provided with a pressing portion connected to the protruding portion, and the pressing portion is extendable through the first extending outlet and the second extending outlet to an outside of the fixing seat.

14. The latching mechanism according to claim 12, wherein a bottom of the latching seat away from the rotating seat is provided with a relief opening communicated with the movable channel; wherein the locking rod is made of a magnetic material, and the locking rod is movable toward the relief opening by a magnetic force from the relief opening.

15. The latching mechanism according to claim 12, wherein a bottom of the latching seat away from the rotating seat is provided with a relief opening communicated with the movable channel, and the locking rod is movable toward the relief opening by a negative pressure from the relief opening.

16. The latching mechanism according to claim 1, wherein the fixing seat is provided with a peripheral plate and an end cap, the peripheral plate is connected to a periphery of the end cap, and the rotating seat is rotatably passed through a central position of the end cap.

17. The latching mechanism according to claim 16, wherein an enclosed space is annularly defined between an outer peripheral surface of the rotating seat and an inner peripheral surface of the peripheral plate, and the elastic energy storage member is disposed in the enclosed space.

18. The latching mechanism according to claim 17, wherein a bottom of the rotating seat is enlarged to a periphery thereof to provide a flip portion, and the flip portion is provided corresponding to the end cap.

19. The latching mechanism according to claim 18, wherein the end cap is provided with a first latch extending toward the flip portion, and the flip portion is provided with a second latch extending toward the end cap, the first latch and the second latch are spaced apart along the enclosed space, an end of the elastic energy storage member is hooked on the first latch, and another end of the elastic energy storage member is hooked on the second latch.

20. A display device, comprising:

a rack;

a display module; and the latching mechanism according to claim 1, wherein the fixing seat is integrated or connected to the rack, and the locking seat is integrated or connected to a bottom shell of the display module.

* * * * *